(12) United States Patent
Beon et al.

(10) Patent No.: US 12,124,065 B2
(45) Date of Patent: Oct. 22, 2024

(54) DISPLAY DEVICE

(71) Applicant: Samsung Display Co., LTD., Yongin-si (KR)

(72) Inventors: Beong-Hun Beon, Yongin-si (KR); Je Seon Yeon, Yongin-si (KR); Duk Jin Lee, Yongin-si (KR); Woo Suk Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/228,040

(22) Filed: Jul. 31, 2023

(65) Prior Publication Data

US 2024/0118473 A1 Apr. 11, 2024

(30) Foreign Application Priority Data

Sep. 16, 2022 (KR) .......................... 10-2022-0117448

(51) Int. Cl.
*G02B 5/30* (2006.01)
*G02F 1/1333* (2006.01)
(Continued)

(52) U.S. Cl.
CPC ..... *G02B 5/3016* (2013.01); *G02F 1/133331* (2021.01); *G02F 1/13363* (2013.01);
(Continued)

(58) Field of Classification Search
CPC ......... G02F 1/133331; G02F 1/133322; G02F 1/13363; G02F 2413/04; G02F 2413/07
See application file for complete search history.

(56) References Cited

U.S. PATENT DOCUMENTS

2010/0149462 A1* 6/2010 Nishino ............ G02F 1/133502
349/102
2015/0060837 A1* 3/2015 Shibanuma ............ H10K 50/15
257/40
(Continued)

FOREIGN PATENT DOCUMENTS

JP 2009192611 A 8/2009
JP 6259925 B2 1/2018
(Continued)

OTHER PUBLICATIONS

Extended European Search Report mailed Feb. 12, 2024 in EP Application No. 23195879.4, 7 pages.

*Primary Examiner* — Jessica M Merlin
(74) *Attorney, Agent, or Firm* — CANTOR COLBURN LLP

(57) ABSTRACT

A display device includes: a display panel and an optical member positioned on the display panel. The optical member includes: a polarization layer positioned on the display panel; a first compensation layer positioned between the display panel and the polarization layer; a second compensation layer positioned between the display panel and the first compensation layer; a third compensation layer positioned between the display panel and the second compensation layer; and a fourth compensation layer positioned between the display panel and the third compensation layer. The first compensation layer is a positive C plate and a thickness direction phase delay value of the first compensation layer is about −65 nm to about −15 nm, and the second compensation layer is a positive A plate and an in-plane phase delay value of the second compensation layer is about 75 nm to about 125 nm.

19 Claims, 26 Drawing Sheets

(51) Int. Cl.
*G02F 1/13363* (2006.01)
*H10K 59/12* (2023.01)
*H10K 59/80* (2023.01)

(52) U.S. Cl.
CPC ....... *H10K 59/875* (2023.02); *G02F 2413/04* (2013.01); *G02F 2413/07* (2013.01); *H10K 59/12* (2023.02)

(56) References Cited

U.S. PATENT DOCUMENTS

2015/0304599 A1* 10/2015 Yamamoto ............. H04N 5/645
    348/836
2017/0192145 A1* 7/2017 Furuki ................... H10K 50/86
2019/0044088 A1* 2/2019 Wu ....................... H10K 50/805
2019/0101677 A1 4/2019 Iida et al.
2019/0288046 A1* 9/2019 Park ..................... H10K 59/131

FOREIGN PATENT DOCUMENTS

| | | | |
|---|---|---|---|
| JP | 6773887 | B2 | 10/2020 |
| KR | 20050029860 | A | 3/2005 |
| KR | 20060038789 | A | 5/2006 |
| KR | 101588500 | B1 | 1/2016 |
| KR | 20170119935 | A | 10/2017 |
| KR | 20180090421 | A * | 8/2018 |
| KR | 101953370 | B1 | 2/2019 |
| WO | 2019009145 | A1 | 1/2019 |

* cited by examiner

FIG. 19

| Posi A #1 Ro / Posi C #1 Rth | 75nm / -40nm | | -15nm | 100nm / -40nm | | 125nm / -40nm | |
|---|---|---|---|---|---|---|---|
| -15nm | | | | ▦ | | | |
| -40nm | | ▦ | ▦ | ▦ | ▦ | ▦ | ▦ |
| -60nm | | ▦ | ▦ | ▦ | ▦ | ▦ | ▦ |
| -80nm | | | | ▦ | | | |
| Posi C #2 Rth | | | | | | | |

(-65nm, 125nm columns as labeled)

FIG. 22

| Posi A #1 Ro | 75nm | | 100nm | | 125nm |
|---|---|---|---|---|---|
| Posi C #1 Rth | -40nm | -15nm | -40nm | -65nm | -40nm |
| -15nm | | | | | |
| Posi C #2 Rth -40nm | | | | | |

DISPLAY DEVICE

This application claims priority to Korean Patent Application No. 10-2022-0117448, filed on Sep. 16, 2022, and all the benefits accruing therefrom under 35 U.S.C. § 119, the content of which in its entirety is herein incorporated by reference.

BACKGROUND

1. Field

The present disclosure relates to a display device.

2. Description of the Related Art

A display device such as liquid crystal display ("LCD"), an organic light emitting device (organic light emitting diode display, "OLED" display), an electrophoretic display, and the like includes a field generating electrode and an electro-optical active layer. For example, the OLED display contains an organic emission layer as an electro-optical active layer. The field generating electrode may be connected to a switching element such as a thin film transistor to receive a data signal, and the electro-optical active layer converts the data signal into an optical signal to display an image.

The display device may include a display portion having a function of displaying an image and an optical unit having an optical function. The optical portion may include, for example, a polarization portion may change a polarization state of light.

Polarization characteristics may be different when viewing such a display device from the front and from the side. For example, light leakage may not occur from the front due to the polarization portion, and light leakage may occur from the side.

SUMMARY

Embodiments are to provide a display device that can prevent light leakage from occurring on front and side surfaces.

A display device according to an embodiment includes: a display panel and an optical member positioned on the display panel, where the optical member includes: a polarization layer positioned on the display panel; a first compensation layer positioned between the display panel and the polarization layer; a second compensation layer positioned between the display panel and the first compensation layer; a third compensation layer positioned between the display panel and the second compensation layer; and a fourth compensation layer positioned between the display panel and the third compensation layer. The first compensation layer is a positive C plate and a thickness direction phase delay value (Rth) of the first compensation layer is about −65 nanometers (nm) to about −15 nm, and the second compensation layer is a positive A plate and an in-plane phase delay value (Ro) of the second compensation layer is about 75 nm to about 125 nm.

The display panel may include: a substrate; a transistor positioned in the substrate; a pixel electrode connected to the transistor; an emission layer positioned on the pixel electrode; a common electrode positioned on the emission layer; a buffer electrode positioned between the emission layer and the common electrode; a capping layer positioned on the common electrode; and an encapsulation layer positioned on the capping layer, and a thickness direction phase delay value (Rth) of the display panel may be about −40 nm to about 0 nm.

The buffer electrode may contain ytterbium.

The encapsulation layer may include: a first inorganic encapsulation layer; an organic encapsulation layer positioned on the first inorganic encapsulation layer; and a second inorganic encapsulation layer positioned on the organic encapsulation layer, and the first inorganic encapsulation layer may include a plurality of layers having different refractive indices.

The first inorganic encapsulation layer may contain at least one of lithium fluoride (LiF), a silicon nitride ($SiN_x$), a silicon oxide ($SiO_x$), and a silicon oxynitride ($SiO_xN_y$).

The third compensation layer may be a positive A plate, and the fourth compensation layer may be a positive C plate.

The third compensation layer may be a quarter wave plate.

An angle between a slow axis of the third compensation layer and a transmissive axis of the polarization layer may be about 45 degrees.

An in-plane phase delay value of the third compensation layer may be about 120 nm to about 150 nm.

A thickness direction phase delay value (Rth) of the fourth compensation layer may be about −60 nm to about −15 nm.

The thickness direction phase delay value (Rth) of the fourth compensation layer may be about −45 nm.

Aa slow axis of the second compensation layer and a transmissive axis of the polarization layer may be orthogonal.

The in-plane phase delay value (Ro) of the second compensation layer may be about 85 nm.

The thickness direction phase delay value (Rth) of the first compensation layer may be about −45 nm.

The first compensation layer, the second compensation layer, the third compensation layer, and the fourth compensation layer may each be formed of a film type or liquid crystal coating layer.

The display device according to the embodiment may further include: a first adhesive member positioned between the second compensation layer and the third compensation layer; and a second adhesive member positioned between the third compensation layer and the fourth compensation layer.

The display device according to the embodiment may further include a window positioned on the optical member, wherein the optical member may be positioned between the display panel and the window.

The display device according to the embodiment may further include: a third adhesive member positioned between the optical member and the window; and a fourth adhesive member positioned between the optical member and the display panel.

The display device according to the embodiment may further include: a rear film positioned under the display panel; and a cushion film positioned under the rear film.

The display device according to the embodiment may further include: a fifth adhesive member positioned between the display panel and the rear film; and a sixth adhesive member positioned between the rear film and the cushion film.

According to the embodiment, it is possible to prevent light leakage from occurring on the front and side surfaces of the display device.

BRIEF DESCRIPTION OF THE DRAWINGS

FIG. 19 shows color coordinates of the azimuthal reflected light of the display device according to an embodiment.

FIG. 22 shows color coordinates of the azimuthal reflected light of the display device according to an embodiment.

DETAILED DESCRIPTION

Figure 1:
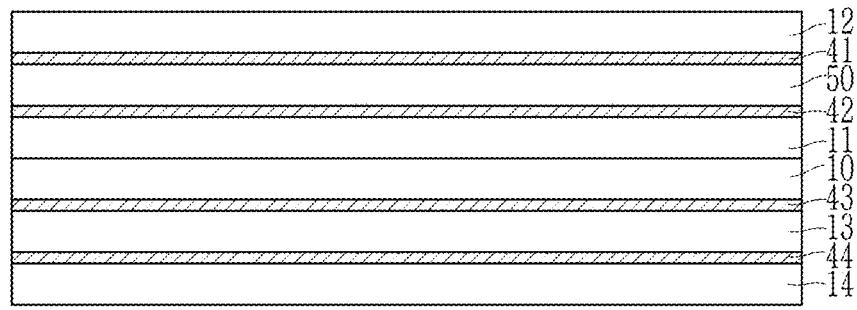
FIG. 1 is a schematic cross-sectional view of a display device according to an embodiment.

Hereinafter, various embodiments of the present invention will be described in detail with reference to the accompanying drawing, and thus a person of an ordinary skill can easily perform it in the technical field to which the present invention belongs. The present invention may be implemented in several different forms and is not limited to the embodiments described herein.

In order to clearly explain the present invention, parts irrelevant to the description are omitted, and the same reference sign is designated to the same or similar constituent elements throughout the specification.

In addition, since the size and thickness of each component shown in the drawing are arbitrarily indicated for better understanding and ease of description, the present invention is not necessarily limited to the drawings. In the drawings, the thickness of layers, films, panels, regions, etc., are exaggerated for clarity. In addition, in the drawings, the thicknesses of some layers and regions are exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

In addition, unless explicitly described to the contrary, the word "comprise", and variations such as "comprises" or "comprising", will be understood to imply the inclusion of stated elements but not the exclusion of any other elements.

In addition, throughout the specification, "on a plane" or "in a plan view" means when the target part is viewed from z-axis direction, and "on a cross-section" means when the target part is vertically cut cross-section when viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, referring to FIG. 1, a display device according to an embodiment will be described.

FIG. 1 is a schematic cross-sectional view of a display device according to an embodiment.

As shown in FIG. 1, a display device according to an embodiment includes a display panel that can display an image, a window 12 positioned on the display panel 10, and an optical member 50 positioned between the display panel 10 and the window 12.

The display panel 10 may include a plurality of pixels and a plurality of signal lines connected thereto. Each of the plurality of pixels may include a plurality of transistors and a light emitting element connected thereto. In this case, the light emitting element may be an organic light emitting element, and the display panel 10 may be formed as an organic light emitting panel. However, the type of display panel 10 is not limited thereto, and may be formed of or include various types of panels. For example, the display panel 10 may be formed of or include a liquid crystal panel, an electrophoretic display panel, an electrowetting display panel, or the like. In addition, the display panel 10 may be formed of or include a next-generation display panel such as a micro light emitting diode ("LED") (Micro LED) display panel, a quantum dot light emitting diode ("QLED") display panel, and a quantum dot organic light emitting diode ("QD-OLED") display panel.

The display device according to an embodiment may further include a touch sensor 11 positioned on the display panel 10. The touch sensor 11 may detect a touch or hovering of an external object. The touch sensor 11 may be provided as a separate panel or film and attached to the display panel 10, or may be provided in the form of a touch layer positioned on the display panel 10.

The window 12 is a member that protects the display panel 10, may be positioned on the light emission surface of the display panel 10, and may be formed of or include a transparent material. The window 12 may include at least one window layer, and each window layer may include a polymer such as plastic or an insulating material such as glass. An adhesive member may be positioned between the stacked plurality of window layers. Although not shown, a window protective layer may be further positioned on the window 12.

The optical member 50 may prevent reflected light from being recognized from the outside by reducing light reflectance of external light incident from the outside. For example, external light is converted to right-circularly polarized light while passing through the optical member 50 and reflected from an electrode or wiring of the display panel 10 to become left-circularly polarized light, and then the reflected light may not be visible from the outside. Accordingly, in the display panel 10, only light according to an image signal is transmitted through the optical member 50 such that the quality of an image to be displayed can be improved.

The display device according to an embodiment may further include an adhesive member 41 positioned between the window 12 and the optical member 50, and an adhesive member 42 positioned between the optical member 50 and the touch sensor 11. The adhesive members 41 and 42 may be formed of or include an optically transparent adhesive ("OCA"), an optically transparent adhesive resin ("OCR"), a pressure sensitive adhesive ("PSA"), an ultraviolet rays curing adhesive, or the like. The adhesive members 41 and 42 may be formed of or include a transparent material.

The display device according to an embodiment may further include a rear film 13 and a cushion film 14 positioned under the display panel 10.

The rear film 13 may include polyimide ("PI"), polyethylene terephthalate ("PET"), polycarbonate ("PC"), polyethylene ("PE"), polypropylene ("PP"), polysulfone ("PSF"), polymethyl methacrylate ("PMMA"), triacetyl cellulose ("TAC"), cycloolefin polymer ("COP"), or the like. The rear film 13 may include a functional layer on at least one side. The functional layer may include, for example, a light absorbing layer. The light absorbing layer may include a light absorbing material such as black pigment or dye. The light absorbing layer is black ink and may be formed on the rear film 13 by coating or printing.

The cushion film 14 may absorb external impact and serve to prevent the display panel 10 from being damaged. The cushion film 14 may be formed of a single layer or a plurality of multilayer. The cushion film 14 may include, for example, a material having elasticity such as polyurethane or polyethylene resin. The cushion film 14 may be made of a foam material similar to a sponge.

The display device according to an embodiment may further include an adhesive member 43 positioned between the display panel 10 and the rear film 13, and an adhesive member 44 positioned between the rear film 13 and the cushion film 14. The adhesive members 43 and 44 may be formed of or include an optically transparent adhesive (OCA), an optically transparent adhesive resin (OCR), a pressure sensitive adhesive (PSA), ultraviolet rays curing adhesive, or the like. The adhesive members 43 and 44 may be made of a transparent material.

Although not shown, a support member, a heat dissipation member, or the like may be further positioned under the cushion film 14. The support member may be made of a metal material or a non-metal material. The support member may be formed of or include a non-metal material, for example, carbon fiber reinforced plastic ("CFRP"), glass fiber reinforced plastic ("GFRP"), aramid fiber reinforced plastic ("AFRP") and the like. The heat dissipation member may serve to diffuse heat generated from the display panel 10 or the like. The heat dissipation member may include a metal having excellent thermal conductivity such as copper or silver, graphite, or carbon nanotube.

Hereinafter, referring to FIG. 2, the display panel 10 of the display device according to an embodiment will be described.

Figure 2:
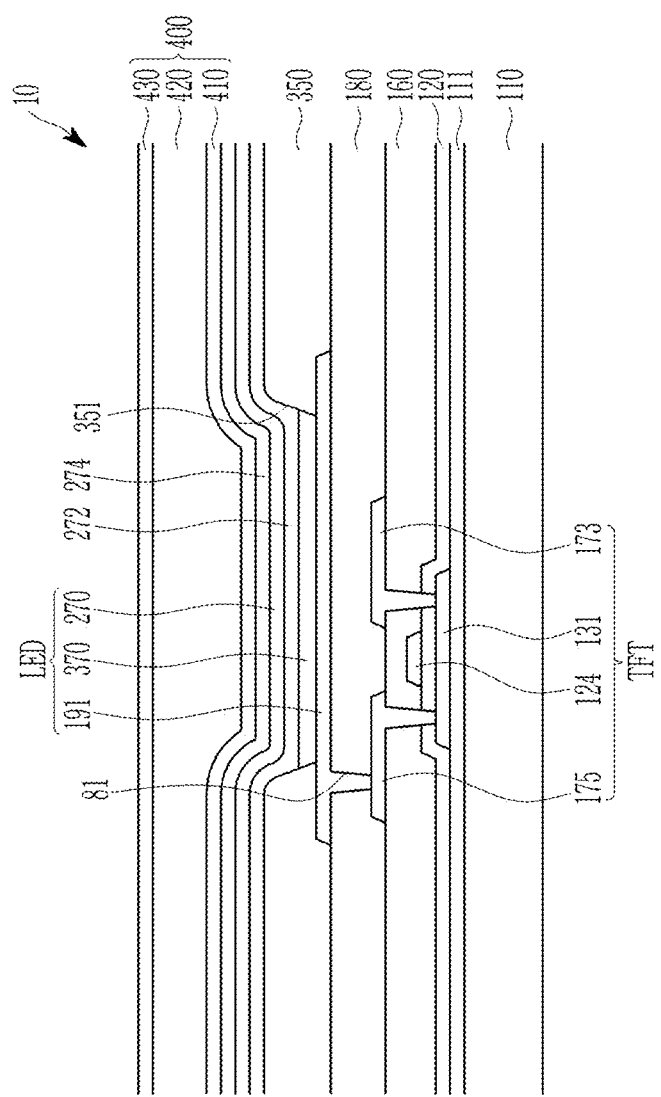
FIG. 2 is a cross-sectional view of the display panel of the display device according to an embodiment.

FIG. 2 is a cross-sectional view of the display panel of the display device according to an embodiment.

As shown in FIG. 2, the display panel 10 of the display device according to an embodiment may include a substrate 110, a transistor TFT positioned on the substrate 110 and including a semiconductor 131, a gate electrode 124, a source electrode 173, and a drain electrode 175, a gate insulating layer 120, a first interlayer-insulating layer 160, a second interlayer-insulating layer 180, a pixel electrode 191, an emission layer 370, a partitioning wall 350, and a common electrode 270. Here, the pixel electrode 191, the emission layer 370, and the common electrode 270 may form a light emitting diode LED.

The substrate 110 may include a material having rigid characteristics such as glass or a flexible material such as plastic or polyimide. A buffer layer 111 for flattening the surface of the substrate 110 and blocking penetration of impurity elements may be further positioned on the substrate 110. The buffer layer 111 may include an inorganic material, and may include an inorganic insulating material such as, for example, a silicon nitride ($SiN_x$), a silicon oxide ($SiO_x$), and a silicon oxynitride ($SiO_xN_y$). The buffer layer 111 may have a single-layer or multi-layered structure of the material. A barrier layer (not shown) may be further positioned on top of the substrate 110. In this case, the barrier layer may be positioned between the substrate 110 and the buffer layer 111. The barrier layer may include an inorganic insulating material such as a silicon nitride ($SiN_x$), a silicon oxide ($SiO_x$), and a silicon oxynitride ($SiO_xN_y$). The barrier layer may be a single layer or multi-layered structure of the material.

The semiconductor 131 may be positioned on the substrate 110. The semiconductor 131 may include any one of amorphous silicon, polycrystalline silicon, and an oxide semiconductor. For example, the semiconductor 131 includes an oxide semiconductor containing low temperature polysilicon ("LTPS") or containing at least one of zinc (Zn), indium (In), gallium (Ga), tin (Sn), and a mixture thereof. For example, the semiconductor 131 may include an indium-gallium-zinc oxide ("IGZO"). The semiconductor 131 may include a channel region, a source region, and a drain region classified according to impurity doping. The source region and drain region may be positioned on either side of the channel region. The source region and drain region may have conductivity characteristics corresponding to conductors.

The gate insulating layer 120 may cover the semiconductor 131 and the substrate 110. The gate insulating layer 120 may include an inorganic insulating material such as a silicon nitride ($SiN_x$), a silicon oxide ($SiO_x$), and a silicon oxynitride ($SiO_xN_y$). The gate insulating layer 120 may have a single-layer or multi-layered structure of the material.

The gate electrode 124 may be positioned on the gate insulating layer 120. The gate electrode 124 may include a metal such as copper (Cu), molybdenum (Mo), aluminum (Al), silver (Ag), chromium (Cr), tantalum (Ta), or titanium (Ti), or a or metal alloy thereof. The gate electrode 124 may be formed of a single layer or multiple layers. A region overlapping the gate electrode 124 on a plane of the semiconductor 131 may be a channel region.

The first interlayer-insulating layer 160 may cover the gate electrode 124 and the gate insulating layer 120. The first interlayer-insulating layer 160 may include an inorganic insulating material such as a silicon nitride ($SiN_x$), a silicon oxide ($SiO_x$), and a silicon oxynitride ($SiO_xN_y$). The first interlayer-insulating layer 160 may have a single-layer or multi-layered structure of the material.

The source electrode 173 and drain electrode 175 may be positioned on the first interlayer-insulating layer 160. The source electrode 173 and the drain electrode 175 are connected to the source region and drain region of the semiconductor 131, respectively, through openings formed in the first interlayer-insulating layer 160 and gate insulating layer 120. Accordingly, the aforementioned semiconductor 131, the gate electrode 124, the source electrode 173, and the drain electrode 175 form one transistor TFT. Depending on embodiments, the transistor TFT may include only the source region and the drain region of the semiconductor 131 instead of the source electrode 173 and the drain electrode 175.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a metal alloy thereof. The source electrode 173 and the drain electrode 175 may be formed of a single layer or multiple layers. For example, the source electrode 173 and the drain electrode 175 may be formed of a triple layer including an upper layer, a middle layer, and a lower layer, and the upper layer and the lower layer may include titanium (Ti) and the middle layer may include aluminum (Al).

The second interlayer-insulating layer 180 may be positioned on the source electrode 173 and the drain electrode 175. The second interlayer-insulating layer 180 may cover the source electrode 173, the drain electrode 175, and the first interlayer-insulating layer 160. The second interlayer-insulating layer 180 may be provided for planarizing the surface of the substrate 110 equipped with the transistor TFT, may be an organic insulator, and may include a at least one metal selected from a group consisting of polyimide, polyamide, acryl resin, benzocyclobutene, and phenol resin.

The pixel electrode 191 may be positioned on the second interlayer-insulating layer 180. The pixel electrode 191 is also called an anode, and may be formed of a single layer including a transparent conductive oxide film or a metal material or a multi-layer including these. The transparent conductive oxide layer may include an indium tin oxide ("ITO"), a poly-ITO, indium zinc oxide ("IZO"), an indium gallium zinc oxide (IGZO), and an indium tin zinc oxide ("ITZO"). The metal material may include silver (Ag), molybdenum (Mo), copper (Cu), gold (Au), and aluminum (Al). For example, the pixel electrode 191 may be formed of a triple layer including an upper layer, an intermediate layer, and a lower layer, the upper and lower layers may include ITO, and the middle layer may include silver (Ag).

The second interlayer-insulating layer 180 may include a via-hole 81 exposing the drain electrode 175. The pixel electrode 191 may be physically and electrically connected to the drain electrode 175 through the via-hole 81 of the second interlayer-insulating layer 180. Accordingly, the pixel electrode 191 may be connected to a transistor TFT, and the pixel electrode 191 may receive an output current to be transmitted from the drain electrode 175 to the emission layer 370.

A partitioning wall 350 may be positioned on the pixel electrode 191 and the second interlayer-insulating layer 180. The partitioning wall 350 is also referred to as a pixel defining layer PDL, and includes a pixel opening 351 overlapping at least a part of the pixel electrode 191. In this case, the pixel opening 351 may overlap a center of the pixel electrode 191 and may not overlap an edge of the pixel electrode 191. Therefore, the size of the pixel opening 351 may be smaller than the size of the pixel electrode 191. The partitioning wall 350 may partition a formation position of the emission layer 370 such that the emission layer 370 may be positioned on a portion where an upper surface of the pixel electrode 191 is exposed. The partitioning wall 350 may be an organic insulator containing at least one material selected from a group consisting of polyimide, polyamide, acryl resin, benzocyclobutene, and phenol resin. Alternatively, the partitioning wall 350 may include an inorganic insulating material such as a silicon nitride ($SiN_x$), a silicon oxide ($SiO_x$), and a silicon oxynitride ($SiO_xN_y$). Alternatively, the partitioning wall 350 may include a light blocking material. In this case, the light blocking material may include carbon black, carbon nanotube, resin containing black dye or paste, a metal particle, for example, nickel, aluminum, molybdenum, and its alloy, a metal oxide particle (e.g., chromium oxide) or a metal nitride particle (e.g., chromium nitride) and the like. When the partitioning wall 350 includes a light blocking material, reflection of external light by metal structures disposed under the partitioning wall 350 may be reduced. However, it is not limited thereto, and the partitioning wall 350 may include a light-transmitting organic insulating material instead of a light-blocking material.

The emission layer 370 may be positioned within the pixel opening 351 partitioned by the partitioning wall 350. The emission layer 370 may overlap the pixel electrode 191. Within the pixel opening 351, the emission layer 370 may be positioned directly above the pixel electrode 191. The emission layer 370 may include an organic material emitting red, green, and blue light. The emission layer 370 may include a low-molecular or high-molecular organic material. In FIG. 2, although the emission layer 370 is shown as a single layer, an auxiliary layer such as a hole injection layer ("HIL"), a hole transporting layer ("HTL"), and an electron transporting layer ("ETL"), and an electron injection layer ("EIL") may be further positioned above and below the emission layer 370. In this case, the hole injection layer and hole transport layer may be positioned below the emission layer 370, and the electron transport layer and electron injection layer may be positioned above the emission layer 370.

The common electrode 270 may be positioned on the partitioning wall 350 and the emission layer 370. The common electrode 270 is also called a cathode, and may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), or transparent conductive oxide such as an indium tin oxide (ITO), an indium zinc oxide (IZO), and the like.

The pixel electrode 191, the emission layer 370, and the common electrode 270 may together form a light emitting diode LED. The light emitting diode LED may be connected to the transistor TFT. In this case, the pixel electrode 191 may be an anode that is a hole injection electrode, and the common electrode 270 may be a cathode that is an electron injection electrode. However, it is not limited to this, and the anode and cathode may be formed in the opposite way according to a driving method of the display device.

Holes and electrons are injected into the emission layer 370 from the pixel electrode 191 and the common electrode 270, respectively, and light emission occurs when the exciton combined with the injected holes and electrons falls from the excited state to the ground state.

The display device according to an embodiment may further include a buffer electrode 272 positioned between the emission layer 370 and the common electrode 270. The buffer electrode 272 may be positioned over the emission layer 370 and the partitioning wall 350. The buffer electrode 272 may be positioned in most regions on the substrate 110. The buffer electrode 272 may include a metal material, for example, ytterbium (Yb).

The display device according to an embodiment may further include a capping layer 274 positioned on the common electrode 270. The capping layer 274 may be formed to cover the entire common electrode 270. The capping layer 274 may be positioned over most regions on the substrate 110. The capping layer 274 may increase optical efficiency by adjusting the refractive index. The capping layer 274 may include an organic insulating material or an inorganic insulating material.

The display device according to an embodiment may further include an encapsulation layer 400 positioned on the capping layer 274. The encapsulation layer 400 may include at least one inorganic layer and at least one organic layer. In the present embodiment, the encapsulation layer 400 may include a first inorganic encapsulation layer 410, an organic encapsulation layer 420, and a second inorganic encapsulation layer 430. A first inorganic encapsulation layer 410 may be positioned on the capping layer 274, an organic encapsulation layer 420 may be positioned on the first inorganic encapsulation layer 410, and a second inorganic encapsulation layer 430 may be positioned on the organic encapsulation layer 420. However, this is only one example, and the number and stacking order of the inorganic and organic layers forming the encapsulation layer 400 may be variously changed. The first inorganic encapsulation layer 410, the organic encapsulation layer 420, and the second inorganic encapsulation layer 430 may be positioned inmost regions above the substrate 110. The encapsulation layer 400 is to protect the light emitting diode LED from moisture or oxygen that may inflow from the outside, and the ends of the first inorganic encapsulation layer 410 and the second inorganic encapsulation layer 430 may directly contact.

The first inorganic encapsulation layer 410 may include a plurality of layers having different refractive indices. For example, the first inorganic encapsulation layer 410 may include three material layers or four material layers having different refractive indices. The first inorganic encapsulation layer 410 may include an inorganic insulating material such as lithium fluoride (LiF), silicon nitride ($SiN_x$), silicon oxide ($SiO_x$), and silicon oxynitride ($SiO_xN_y$).

The characteristics of the display panel 10 may vary according to the refractive index, thickness, or the like of various material layers that form the display panel 10 of the display device according to an embodiment.

For example, a display panel 10 of a display device according to Embodiment 1 may include a buffer electrode 272, a common electrode 270, a capping layer 274, and a first inorganic encapsulation layer 410. In this case, the buffer electrode 272 may include ytterbium (Yb), and a thickness of the buffer electrode 272 may be about 13 nanometers (nm). The common electrode 270 may include AgMg, and the common electrode 270 may have a thickness of about 95 nm. A refractive index of the capping layer 274 may be about 2, and a thickness of the capping layer 274 may be about 950 nm. The first inorganic encapsulation layer 410 may formed in a form in which lithium fluoride (LiF) with a refractive index of about 1.4 and a thickness of about 400 nm, silicon oxynitride ($SiO_xN_y$) with a refractive index of about 1.89 and a thickness of about 1350 nm, silicon oxynitride ($SiO_xN_y$) with a refractive index of about 1.62 and a thickness of about 9000 nm, and silicon oxide ($SiO_x$) having a refractive index of about 1.57 and a thickness of about 800 nm are sequentially stacked. A thickness direction phase delay value Rth of the display panel 10 may be about 0.1 nm. (Based on when the incident light wavelength is 550 nm) As used herein, the "thickness" is measured in a thickness direction (i.e., z-axis direction).

As another example, a display panel 10 of a display device according to Embodiment 2 may include a buffer electrode 272, a common electrode 270, a capping layer 274, and a first inorganic encapsulation layer 410. In this case, the buffer electrode 272 may include ytterbium (Yb), and a thickness of the buffer electrode 272 may be about 13 nm. The common electrode 270 may include AgMg, and the common electrode 270 may have a thickness of about 95 nm. A refractive index of the capping layer 274 may be about 1.9, and a thickness of the capping layer 274 may be about 620 nm. The first inorganic encapsulation layer 410 may be formed in a format in which about 600 nm of silicon oxide ($SiO_x$) with a refractive index of about 1.5, about 9000 nm of silicon oxynitride ($SiO_xN_y$) with a refractive index of about 1.89, and about 700 nm of silicon oxynitride ($SiO_xN_y$) with a refractive index of about 1.7 are sequentially stacked. A thickness direction phase delay value Rth of the display panel 10 may be about −39.4 nm. (Based on when the incident light wavelength is 550 nm)

In addition to the two examples, the refractive index and thickness of various material layers that form the display panel 10 of the display device according to an embodiment may be variously changed. Accordingly, the thickness direction phase delay value Rth of the display panel 10 of the display device according to an embodiment may be variously changed in a range of about −40 nm to about 0 nm.

Hereinafter, an optical member 50 of a display device according to an embodiment will be described with reference to FIG. 3 to FIG. 6.

Figure 3:
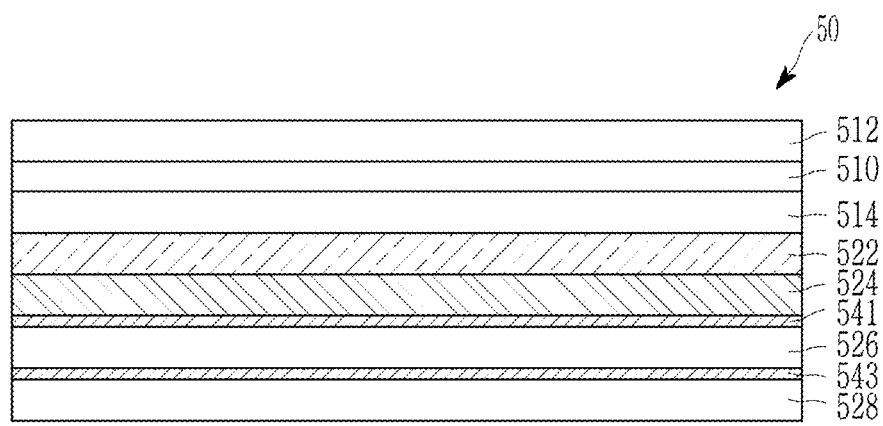
FIG. 3 is a cross-sectional view of an optical member according to display device according to an embodiment.
Figure 4:
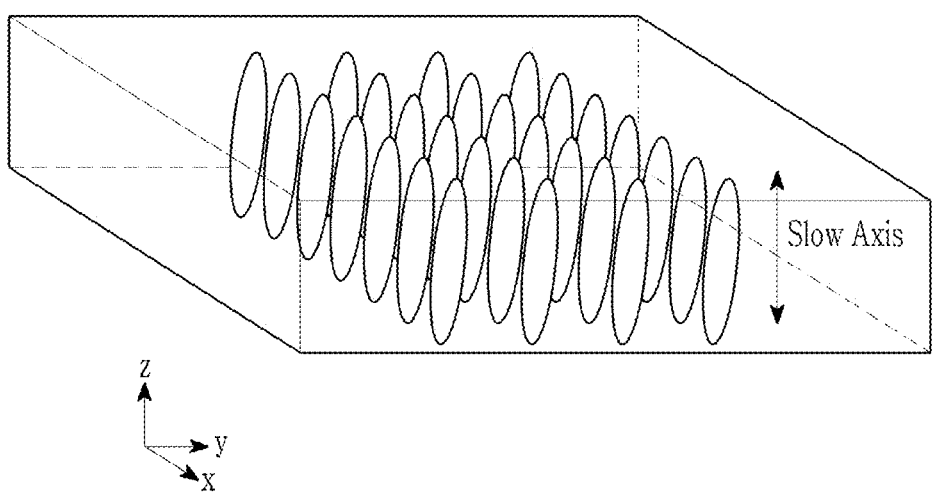
FIG. 4 and FIG. 5 show a structure of some layers of the optical member of the display device according to an embodiment.
Figure 5:
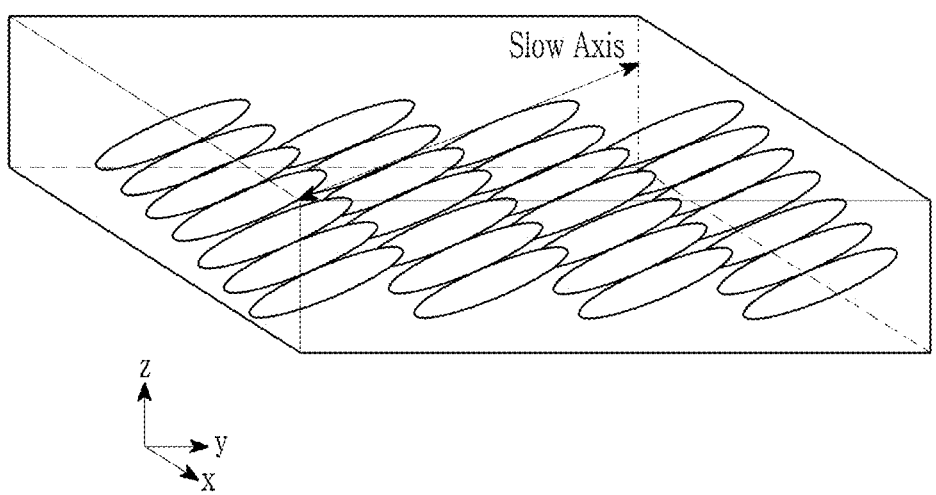
Figure 6:
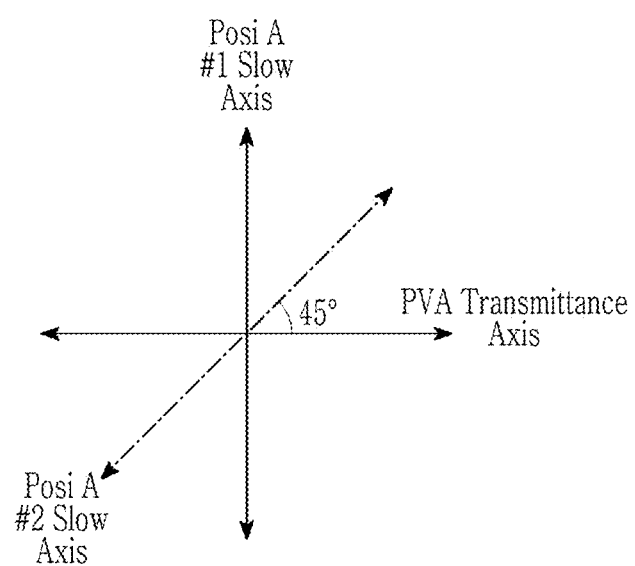
FIG. 6 shows a transmissive axis and a slow axis of some layers of the optical member of the display device according to an embodiment.

FIG. 3 is a cross-sectional view of an optical member according to display device according to an embodiment, FIG. 4 and FIG. 5 show a structure of some layers of the optical member of the display device according to an embodiment, and FIG. 6 shows a transmissive axis and a slow axis of some layers of the optical member of the display device according to an embodiment. FIG. 4 shows a structure of a first compensation layer of the optical member, and FIG. 5 shows a structure of a second compensation layer of the optical member.

As shown in FIG. 3, an optical member 50 of a display device according to an embodiment includes a polarization layer 510, a first compensation layer 522, a second compensation layer 524, a third compensation layer 526, and a fourth compensation layer 528 that are positioned below the polarization layer 510.

The polarization layer 510 may be positioned between the display panel 10 and the window 12. The polarization layer 510 may be a straight line polarizer that converts incident light incident from the outside into the optical member 50 into linear polarization. The polarization layer 510 may include a transmissive axis and an absorption axis. The polarization layer 510 may pass light vibrating in a transmissive axis direction and block light vibrating in an absorption axis direction that is perpendicular to the transmissive axis.

The polarization layer 510 may include polyvinyl alcohol ("PVA") as a polarization material. Specifically, in the polarization layer 510, a dichroism dye such as iodine is oriented and adsorbed to a layer containing stretched polyvinyl alcohol, and may have a polarization function. The polarization layer 510 may be in the form of a film, or may be a liquid crystal coating type polarizer including aligned liquid crystals.

The optical member 50 of the display device according to an embodiment may further include a first protective layer 512 and a second protective layer 514 positioned on different surfaces of the polarization layer 510, respectively. The first protective layer 512 may be positioned on the polarization layer 510. Accordingly, the first protective layer 512 may be positioned between the polarization layer 510 and the window 12. The second protective layer 514 may be positioned under the polarization layer 510. Therefore, the second protective layer 514 may be positioned between the polarization layer 510 and the first compensation layer 522.

The first protective layer 512 and the second protective layer 514 may serve to protect the polarization layer 510 and may be formed of or include a general protective film without phase retardation. For example, the first protective layer 512 and the second protective layer 514 may include materials such as triacetyl cellulose (TAC), cycloolefin polymer (COP), polymethyl methacrylate ("PMMA"), and polyethylene terephthalate (PET).

The first compensation layer 522, second compensation layer 524, third compensation layer 526, and fourth compensation layer 528 may each be formed in the form of a film. For example, the first compensation layer 522, the second compensation layer 524, the third compensation layer 526, and the fourth compensation layer 528 use materials such as polycarbonate (PC), triacetyl cellulose (TAC), and cycloolefin polymer (COP). In the case of film, the desired phase difference can be obtained by adjusting a stretching ratio of the materials. However, it is not limited thereto, and the first compensation layer 522, the second compensation layer 524, the third compensation layer 526, and the fourth compensation layer 528 may each be formed of or include a liquid crystal coating layer in another embodiment. The first compensation layer 522, the second compensation layer 524, the third compensation layer 526, and the fourth compensation layer 528 may each include one or more monomeric liquid crystals. For example, the liquid crystal monomer may include a compound represented by Chemical Formula 1.

[Chemical Formula 1]

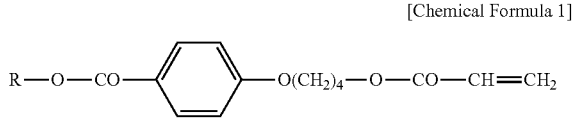

The first compensation layer 522, the second compensation layer 524, the third compensation layer 526, and the fourth compensation layer 528 may each include a positive C plate or a positive A plate. As shown in FIG. 4, in the case of positive C plate, the liquid crystal monomers may be arranged vertically with respect to the plane direction, that is, in parallel with the thickness direction (i.e., z-axis direction). In this case, the slow axis of the positive C plate may be parallel to the thickness direction. As shown in FIG. 5, in the case of positive A plate, the liquid crystal monomers can be aligned in the plane direction. In this case, the slow axes of the positive A plate may be parallel to the plane direction. Here, the plane direction is a direction on a plane defined by x-axis direction and y-axis direction and perpendicular to the thickness direction.

The first compensation layer 522, the second compensation layer 524, the third compensation layer 526, and the fourth compensation layer 528 may each have refractive index values nx, ny, and nz in x, y, and z-axis directions, respectively. The first compensation layer 522, the second compensation layer 524, the third compensation layer 526, and the fourth compensation layer 528 may each have a predetermined in-plane phase delay value Ro and a thickness direction phase delay value Rth. The in-plane phase delay value Ro and the thickness direction phase delay value Rth are values defined by Equation 1 and Equation 2 below, respectively, and d means a thickness of the compensation layer. These optical characteristics can be expressed based on the case where the wavelength of the light source is 550 nm.

$$Ro=(nx-ny)*d \qquad \text{[Equation 1]}$$

$$Rth=((nx+ny)/2-nz)*d \qquad \text{[Equation 2]}$$

The first compensation layer 522 may be positioned under the polarization layer 510. The first compensation layer 522 may be positioned between the display panel 10 and the polarization layer 510. The second protective layer 514 may further be positioned between the polarization layer 510 and the first compensation layer 522. The first compensation layer 522 may be made of a positive C plate. A thickness direction phase delay value Rth of the first compensation layer 522 may be about −65 nm to about −15 nm. More preferably, the thickness direction phase delay value Rth of the first compensation layer 522 may be about −45 nm.

The second compensation layer 524 may be positioned below the first compensation layer 522. The second compensation layer 524 may be positioned between the display panel 10 and the first compensation layer 522. The second compensation layer 524 may be formed of or include a positive A plate. An in-plane phase delay value Ro of the second compensation layer 524 may be about 75 nm to about 125 nm. More preferably, the in-plane phase delay value Ro of the second compensation layer 524 may be about 85 nm. As shown in FIG. 6, the slow axis (Posi A #1 Slow Axis) of the second compensation layer 524 may be orthogonal to the transmissive axis (PVA transmittance axis) of the polarization layer 510.

The third compensation layer 526 may be positioned below the second compensation layer 524. The third compensation layer 526 may be positioned between the display panel 10 and the second compensation layer 524. The third compensation layer 526 may be formed of or include a positive A plate. The third compensation layer 526 may include a λ/4 phase retarder (i.e., quarter wave plate, "QWP"). The λ/4 phase retarder (QWP) may convert linear polarization into circular polarization by assigning a phase difference of λ/4. An in-plane phase delay value Ro of the third compensation layer 526 may be about 120 nm to about 150 nm. More preferably, the in-plane phase delay value Ro of the third compensation layer 526 may be about 141 nm. As shown in FIG. 6, an angle between the slow axis (Posi A #2 Slow Axis) of the third compensation layer 526 and the transmissive axis (PVA Transmittance Axis) of the polarization layer 510 may be about 45 degrees.

The fourth compensation layer 528 may be positioned under the third compensation layer 526. The fourth compensation layer 528 may be positioned between the display panel 10 and the third compensation layer 526. The fourth compensation layer 528 may be formed of or include a positive C plate. A thickness direction phase delay value Rth of the fourth compensation layer 528 may be about −60 nm to about −15 nm. More preferably, the thickness direction phase delay value Rth of the fourth compensation layer 528 may be about −45 nm.

The optical member 50 of the display device according to an embodiment may further include an adhesive member 541 positioned between the second compensation layer 524 and the third compensation layer 526, and an adhesive member 543 positioned between the third compensation layer 526 and the fourth compensation layer 528. The adhesive members 541 and 543 may contain an acryl-based copolymer that has excellent elasticity and adhesion characteristics and can prevent peeling by reducing the generation of fine vapor. For example, the adhesive members 541 and 543 may be made of pressure sensitive adhesive (PSA) or the like. The adhesive members 541 and 543 may serve protect the compensation layers or the display panel 10 from external impact by having a certain elasticity as well as an adhesive role.

As described above, the first compensation layer 522 of the optical member 50 of the display device according to an embodiment may be positioned under the polarization layer 510, and the second compensation layer 524 may be positioned under the first compensation layer 522. However, it is not limited thereto, and positions of the first compensation layer 522 and the second compensation layer 524 may be interchanged. For example, the second compensation layer 524 may be positioned under the polarization layer 510, and the first compensation layer 522 may be positioned under the second compensation layer 524. That is, the second compensation layer 524 may be positioned between the polarization layer 510 and the first compensation layer 522.

As described above, the third compensation layer 526 of the optical member 50 of the display device according to an embodiment may be formed of or include a positive A plate made of a λ/4 phase retarder (QWP) single layer. In this case, the in-plane phase delay value Ro of the third compensation layer 526 may be about 120 nm to about 150 nm, and an angle between the slow axis (Posi A #2 Slow Axis) of the third compensation layer 526 and the transmissive axis (PVA Transmittance Axis) of the polarization layer 510 may be about 45 degrees. However, it is not limited thereto, and the third compensation layer 526 may be formed of or include a positive A plate including two layers. Two layers forming the third compensation layer 526 may include a λ/2 phase retarder ("HWP") and a λ/4 phase retarder (QWP). In this case, an in-plane phase delay value Ro of the λ/2 phase retarder HWP may be about 200 nm to about 250 nm, and an in-plane phase delay value Ro of the λ/4 phase retarder QWP may be about 100 nm to about 130 nm. An angle between the slow axis of the λ/2 phase retarder (HWP) and the transmissive axis of the polarization layer 510 may be about 17.5 degrees, and an angle between the slow axis of the λ/4 phase retarder (QWP) and the λ/2 phase retarder (HWP) may be about 60 degrees. When the third compensation layer 526 includes a λ/2 phase delay (HWP) and a λ/4 phase delay (QWP), the fourth compensation layer 528 can be omitted, and the thickness direction phase delay value Rth of the first compensation layer 522 may be about −100 nm to about −10 nm. More preferably, the thickness direction phase delay value Rth of the first compensation layer 522 may be about −40 nm to about −15 nm.

Hereinafter, a display device according to an embodiment and a display device according to a referential example will be compared with reference to FIG. 7 to FIG. 15.

Figure 7:
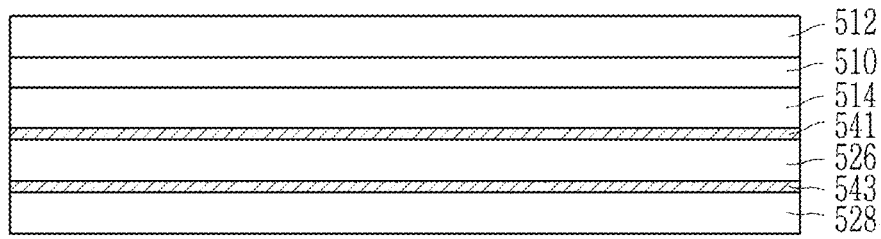
FIG. 7 is a cross-sectional view of an optical member of a display device according to a referential example.
Figure 8:
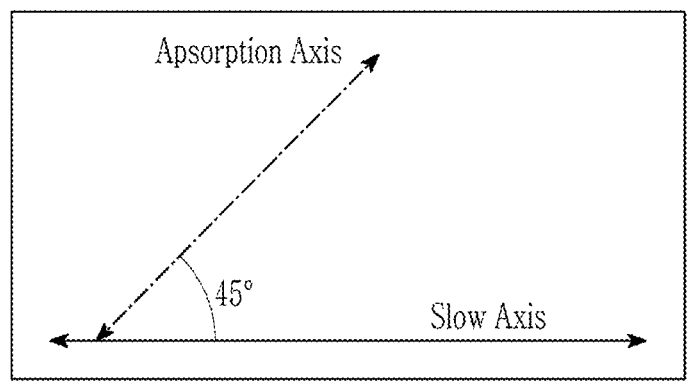
FIG. 8 shows an absorption axis and a slow axis of a certain layer of the optical member of the display device according to the reference example.
Figure 9:
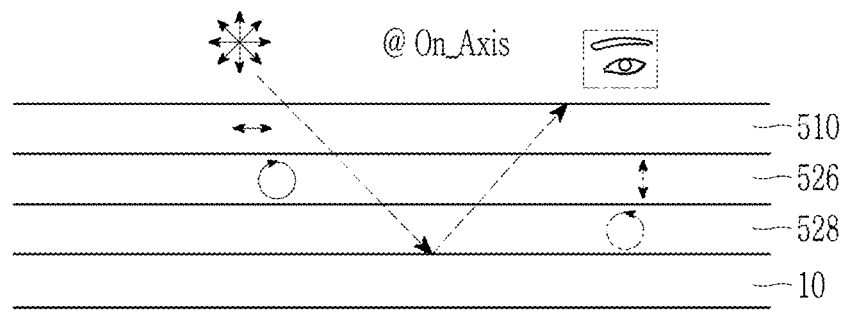
FIG. 9 shows a light path within the optical member of the display device according to the reference example.
Figure 10:
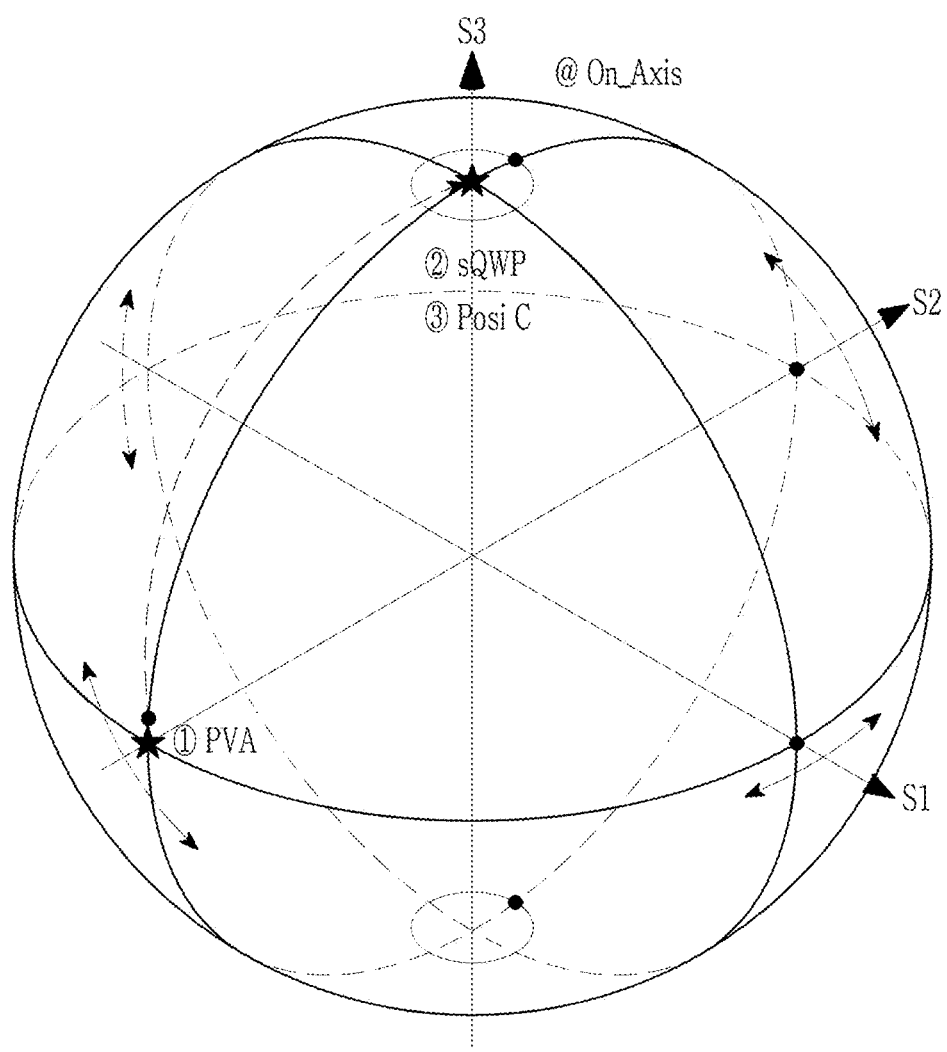
FIG. 10 shows a polarization state according to the light path on the Poincare sphere in the optical member of the display device according to the reference example.
Figure 11:
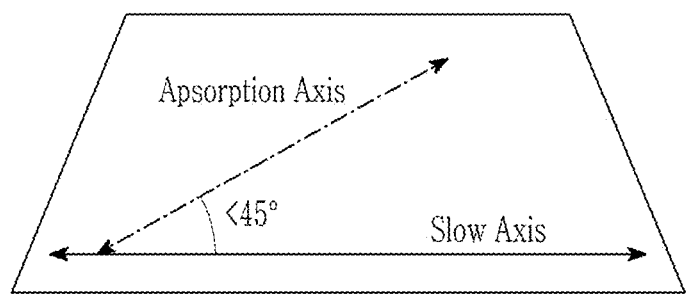
FIG. 11 shows an absorption axis and a slow axis of some layers of an optical member of a display device according to a reference example.
Figure 12:
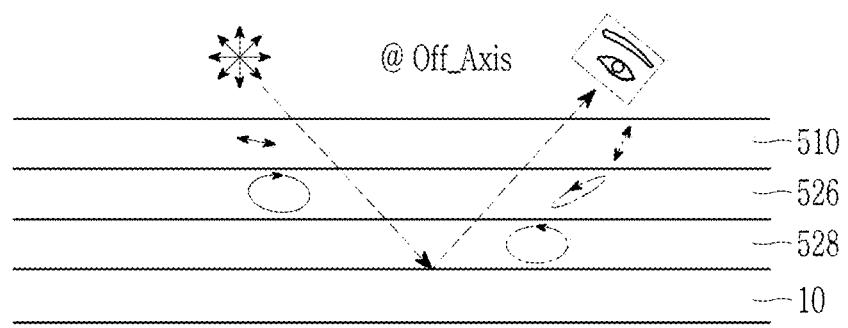
FIG. 12 shows a light path within the optical member of the display device according to the reference example.
Figure 13:
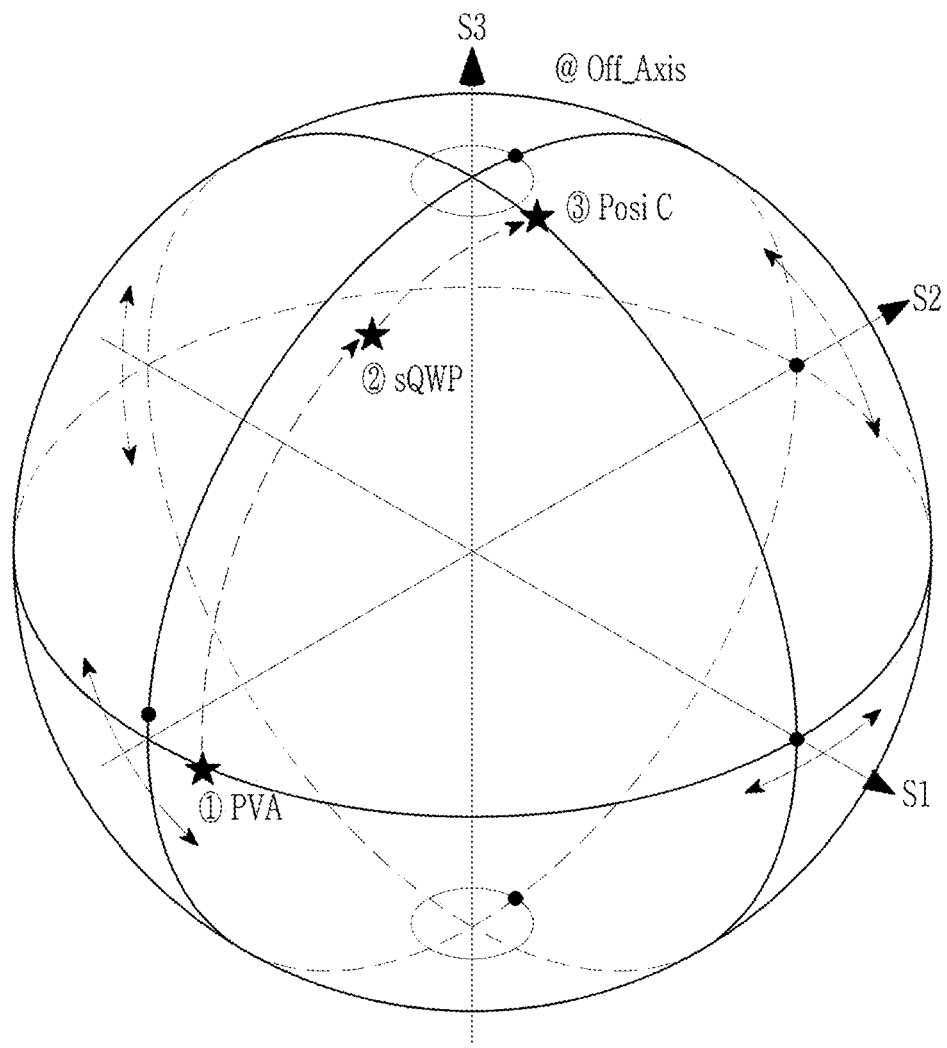
FIG. 13 shows a polarization state according to the light path on the Poincare sphere in the optical member of the display device according to the reference example.
Figure 14:
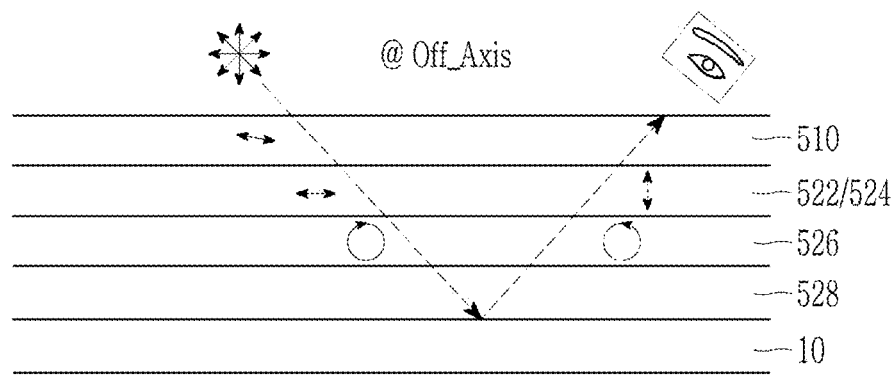
FIG. 14 shows a light path in an optical member of a display device according to an embodiment.
Figure 15:
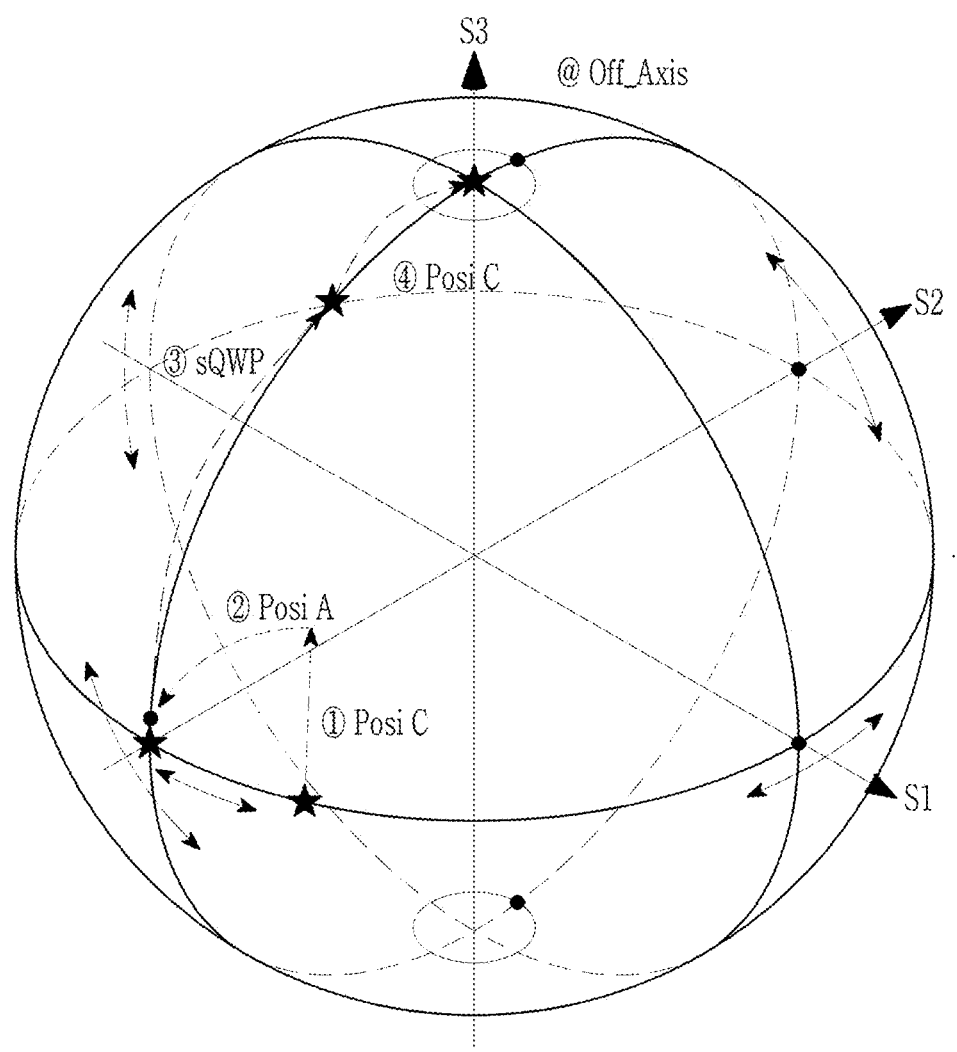
FIG. 15 shows a polarization state according to the light path on the Poincare sphere in the optical member of the display device according to the embodiment.

FIG. 7 is a cross-sectional view of an optical member of a display device according to a referential example. FIG. 8 shows an absorption axis and a slow axis of some layers of the optical member of the display device according to the reference example, FIG. 9 shows a light path within the optical member of the display device according to the reference example, and FIG. 10 shows a polarization state according to the light path on the Poincare sphere in the optical member of the display device according to the reference example. FIG. 11 shows an absorption axis and a slow axis of some layers of an optical member of a display device according to a reference example, FIG. 12 shows a light path within the optical member of the display device according to the reference example, and FIG. 13 shows a polarization state according to the light path on the Poincare sphere in the optical member of the display device according to the reference example. FIG. 14 shows alight path in an optical member of a display device according to an embodiment, and FIG. 15 shows a polarization state according to the light path on the Poincare sphere in the optical member of the display device according to the embodiment. FIG. 8 to FIG. 10 are drawings based on a view from the front, FIG. 11 to FIG. 15 are drawings based on a side view.

As shown in FIG. 7, an optical member of a display device according to the reference example includes a polarization layer 510, a third compensation layer 526, and a fourth compensation layer 528 positioned under the polarization layer 510. The optical member of the display device according to the reference example differs from the optical member of the display device according to an embodiment in that the first and second compensation layers are not positioned between the polarization layer 510 and the third compensation layer 526.

The third compensation layer 526 may be positioned between the polarization layer 510 and the fourth compensation layer 528. The third compensation layer 526 may be formed of or include a positive A plate. The third compensation layer 526 may include a quarter wave plate QWP. An in-plane phase delay value Ro of the third compensation layer 526 may be about 141 nm.

The fourth compensation layer 528 may be formed of or include a positive C plate. A thickness direction phase delay value Rth of the fourth compensation layer 528 may be about −75 nm.

As shown in FIG. 8, when viewed from the front (i.e., view in z-axis direction), an angle between the slow axis of the third compensation layer 526 and the absorption axis of the polarization layer 510 of the optical member of the display device according to the reference example may be about 45 degrees.

As shown in FIG. 9 and FIG. 10, when viewed from the front (On_Axis), light incident from the outside to the optical member of the display device according to the reference example may be changed to linearly polarized light while passing through the polarization layer 510, and is positioned at ① on the Poincare sphere. The light passing through the polarization layer 510 may be changed from the linearly polarized light to right-circularly polarized light while passing through the third compensation layer 526, and is positioned at ②, which is S3 (target point), on the Poincare sphere. The light passing through the third compensation layer 526 is not phase delayed while passing through the fourth compensation layer 528, and is positioned at the same position as ② and ③. Light passing through the fourth compensation layer 528 may change from right-circularly polarized light to left-circularly polarized light while being reflected on the display panel 10. Light reflected from the display panel 10 may be changed to linearly polarized light while passing through the third compensation layer 526 without being phase delayed while passing through the fourth compensation layer 528. A vibration direction of the linearly polarized light incident from the outside and passing through the polarization layer 510 is parallel to the transmissive axis of the polarization layer 510, and a vibration direction of linearly polarized light reflected from the display panel 10 and passing through the third compensation layer 526 may be perpendicular to the transmissive axis of polarization layer 510. That is, the vibration direction of the linearly polarized light that is reflected on the display panel 10 and passes through the third compensation layer 526 may be parallel to the absorption axis of the polarization layer 510. Accordingly, light reflected by the display panel 10 and passing through the third compensation layer 526 may be absorbed by the polarization layer 510, and external light may be prevented from being reflected and viewed when viewed from the front.

As shown in FIG. 11, when viewed from the side, an angle between the slow axis of the third compensation layer 526 and the absorption axis of the polarization layer 510 of the optical member of the display device according to the reference example is less than 45 degrees.

As shown in FIG. 12 and FIG. 13, when viewed from the side (Off_Axis) (for example, when viewed at a viewing angle of 60 degrees), light incident from the outside to the optical member of the display device according to the reference example may be changed to oblique-linearly polarized light due to distortion of the absorption axis of the polarization layer 510 while passing through the polarization layer 510 and may be positioned at ① on the Poincare sphere. Light passing through the polarization layer 510 may be changed to incomplete right-circularly polarized light (for example, it may be elliptical polarized light) due to distortion of the slow axis of the third compensation layer 526 while passing through the third compensation layer 526, and may be positioned at ② on the Poincare sphere, which falls short of S3 (target point). Light passing through the third compensation layer 526 may be corrected for its movement amount by a thickness direction phase delay value Rth while passing through the fourth compensation layer 528, and is positioned at ③ on the Poincare sphere. Light passing through the fourth compensation layer 528 may change from incomplete right-circularly polarized light to incomplete left-circularly polarized light while being reflected on the display panel 10. Light reflected from the display panel 10 may be changed to imperfect linearly polarized light while passing through the fourth compensation layer 528 and then the third compensation layer 526. A vibration direction of the linearly polarized light that is reflected on the display panel 10 and passes through the third compensation layer 526 may not be parallel to the absorption axis of the polarization layer 510. Accordingly, a part of the light reflected by the display panel 10 and passing through the third compensation layer 526 may be absorbed by the polarization layer 510, and the other part may be transmitted and recognized as light leakage.

As shown in FIG. 14 and FIG. 15, when viewed from the side (Off_Axis) (for example, when viewed from a viewing angle of 60 degrees), light incident from the outside into the optical member of the display device according to an embodiment may be changed to oblique-linearly polarized light due to distortion of the absorption axis (Absorption Axis) of the polarization layer 510 while passing through the polarization layer 510. The light passing through the polarization layer 510 may move as much as ① and ② on the Poincare sphere while passing through the first compensation layer 522 and the second compensation layer 524, respectively, to compensate for the position of the distortion of the absorption axis of the polarization layer 510. Accordingly, a vibration direction of the compensated linearly polarized light may be parallel to the transmissive axis of the polarization layer 510. Light passed through the first compensation layer 522 and the second compensation layer 524 may change from linear polarization to right circle polarization while passing through the third compensation layer 526. In this case, the light passing through the third compensation layer 526 is positioned at ③ on the Poincare sphere that is short of (close to) S3 (target point) due to the distortion of the slow axis of the third compensation layer 526. The light passing through the third compensation layer 526 may correct a movement amount by a thickness direction phase delay value Rth while passing through the fourth compensation layer 528, and is positioned at ④, which is S3 (target point), on the Poincare sphere. While passing through the fourth compensation layer 528, the light completely right-circularly polarized light at S3 (target point) may be reflected on the display panel 10 and changed to left circularly polarized light. Light reflected from the display panel 10 may passes through the fourth compensation layer 528 and then may be change to linearly-polarized light while passing through the third compensation layer 526. A vibration direction of the linearly polarized light that is reflected on the display panel 10 and passed through the third compensation layer 526 may be parallel to the absorption axis of the polarization layer 510. Accordingly, light reflected by the display panel 10 and passed through the third compensation layer 526 may be absorbed by the polarization layer 510, and external light may be prevented from being reflected and recognized when viewed from the side of the display device according to an embodiment.

In summary, when viewing the display device according to the reference example from the front, the reflection of external light may be reduced by the optical member, but when viewing from the side, light leakage occurs due to the distortion of the absorption axis of the polarization layer and the slow axis of the compensation layer. However, in the display device according to an embodiment, distortion of the absorption axis of the polarization layer and the slow axis of the compensation layer may be compensated for by the first and second compensation layers 522 and 524 of the optical member, and reflection of external light may be effectively reduced not only when viewed from the front but also from the side.

Next, referring to FIG. 16 to FIG. 22, the amount of light leakage of the display device according to an embodiment and the display device according to the reference example are compared.

Figure 16:
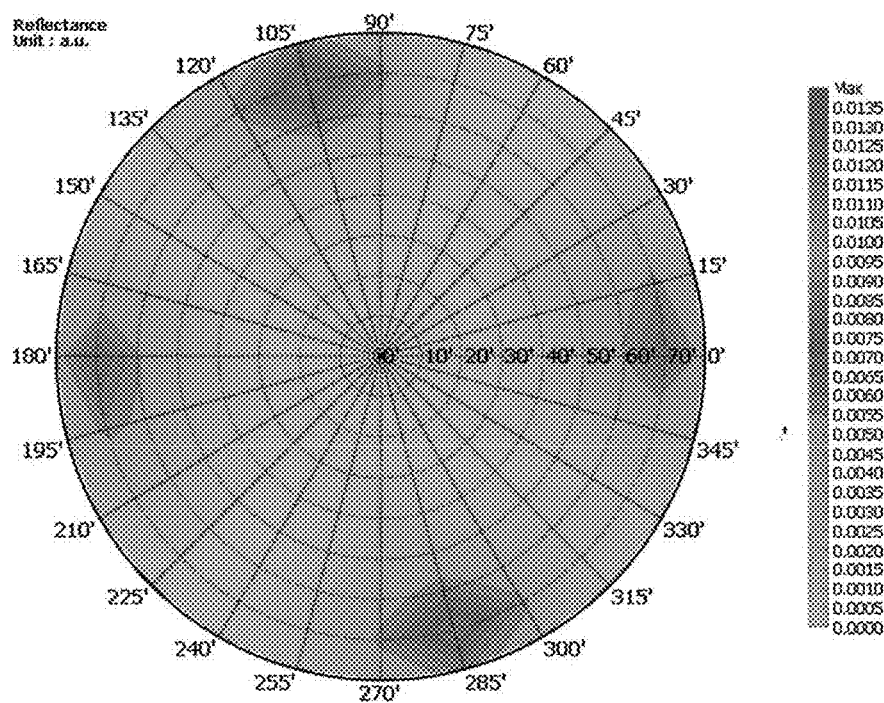
FIG. 16 shows light reflectance according to a viewing angle of the display device according to the reference example.
Figure 17:
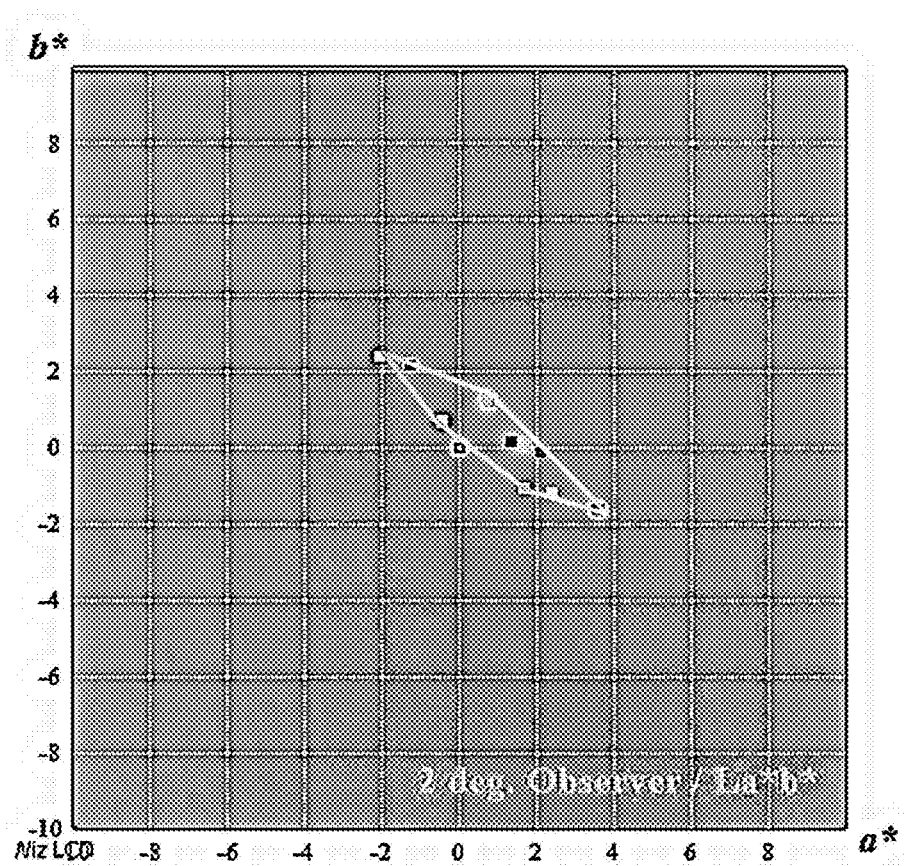
FIG. 17 shows color coordinates (azimuthal reflect color) of azimuthal reflected light of the display device according to the reference example.
Figure 18:
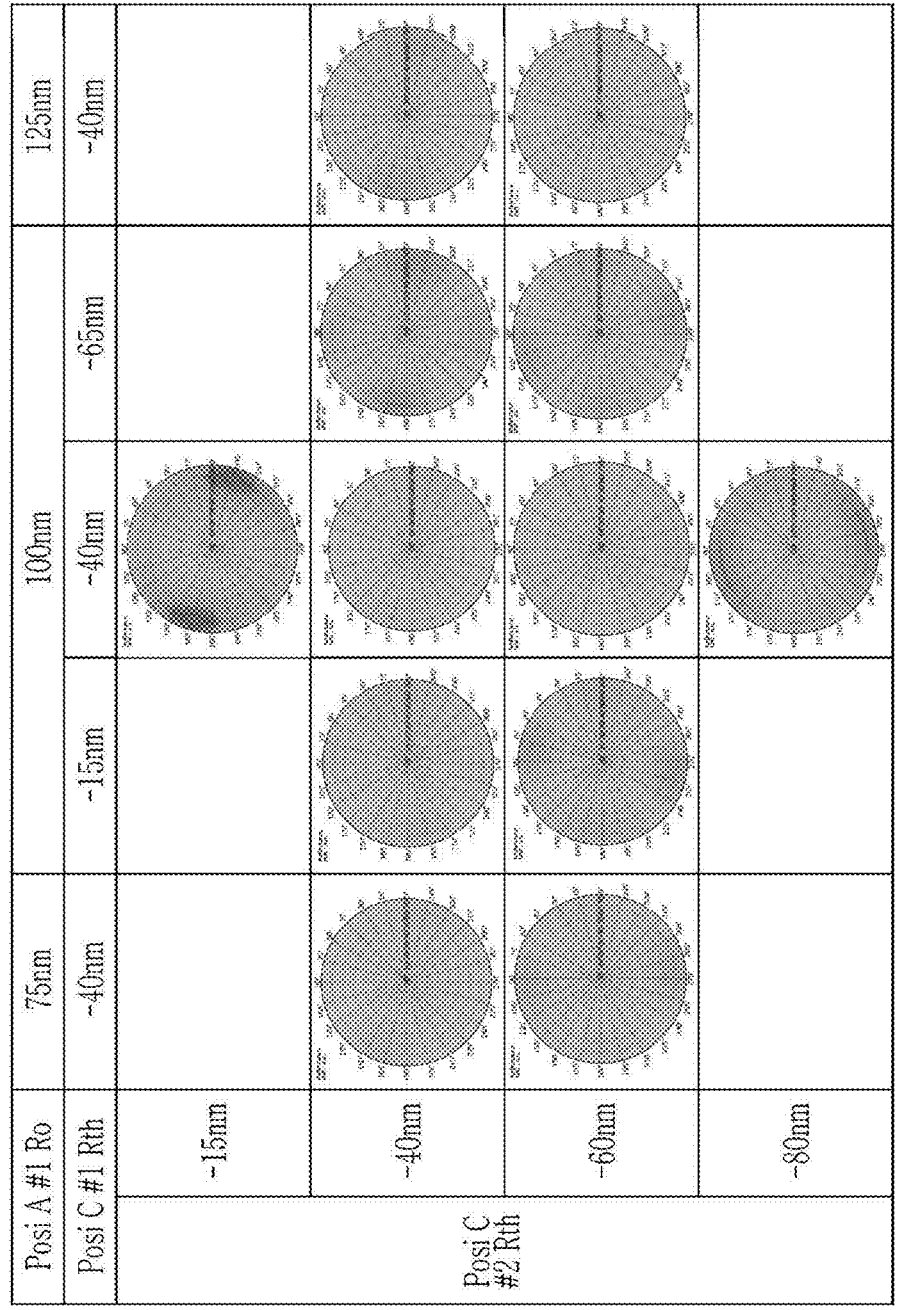
FIG. 18 shows the light reflectance according to a viewing angle of the display device according to an embodiment.
Figure 20:
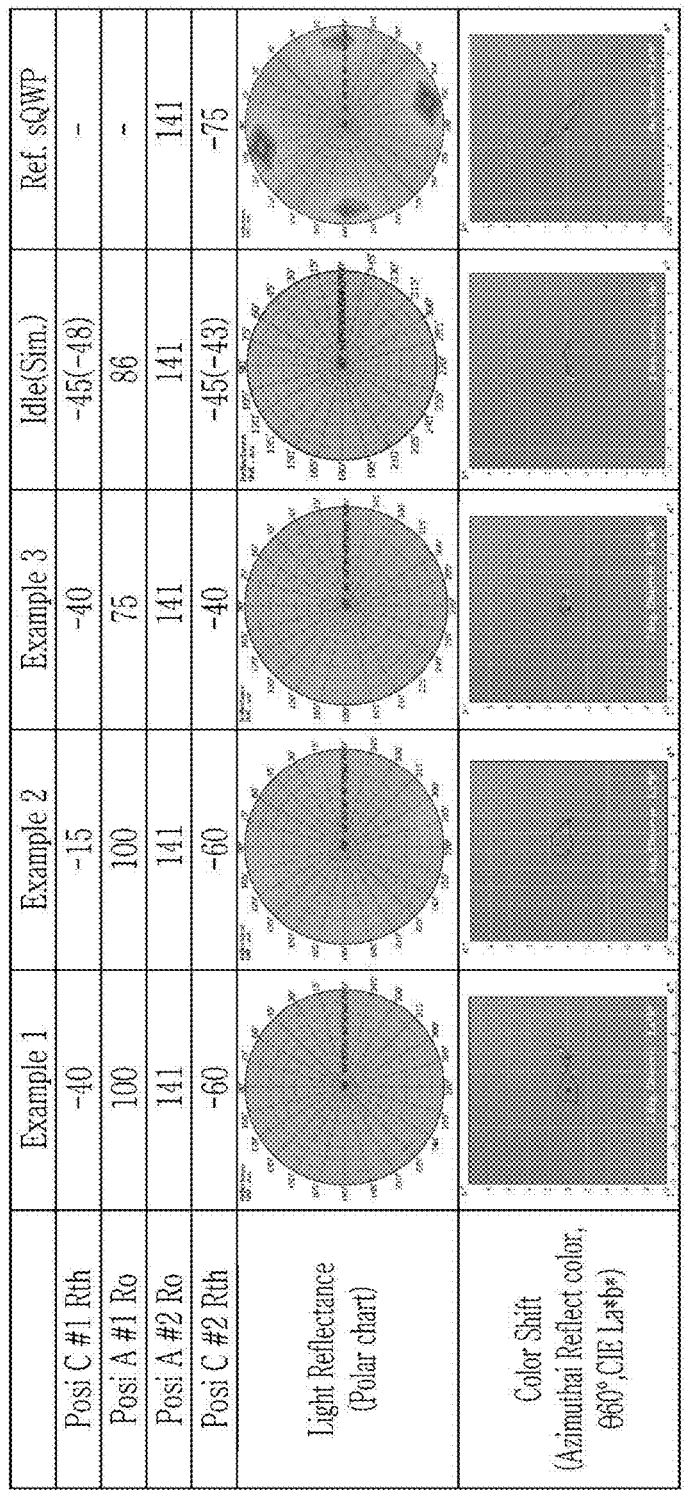
FIG. 20 shows light reflectance and color coordinates of azimuthal reflected light according to viewing angles of a display device according to a display device and an embodiment according to a reference example.
Figure 21:
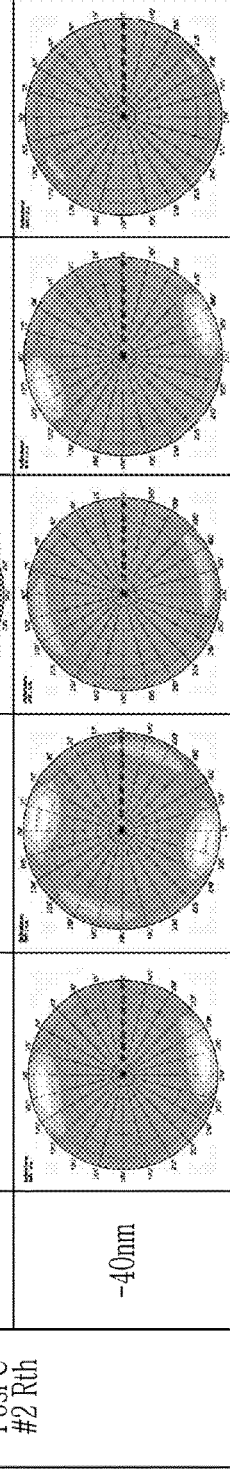
FIG. 21 shows the light reflectance according to a viewing angle of the display device according to an embodiment.

FIG. 16 shows light reflectance according to a viewing angle of the display device according to the reference example, and FIG. 17 shows color coordinates (azimuthal reflect color) of azimuthal reflected light of the display device according to the reference example. FIG. 18 shows the light reflectance according to a viewing angle of the display device according to an embodiment, FIG. 19 shows color coordinates of the azimuthal reflected light of the display device according to an embodiment. FIG. 20 shows light reflectance and color coordinates of azimuthal reflected light according to viewing angles of a display device according to a display device and an embodiment according to a reference example. FIG. 21 shows the light reflectance according to a viewing angle of the display device according to an embodiment, FIG. 22 shows color coordinates of the azimuthal reflected light of the display device according to an embodiment.

Color coordinates in FIG. 17, FIG. 19, FIG. 20, and FIG. 22 indicate coordinates in the CIE L*a*b* color space, and indicate colors as coordinates on a uniform color space composed of lightness L* and chromanetics indices a* and b*. In a*, a positive direction represents red and a negative direction represents green. In b*, a positive direction represents yellow and a negative direction represents blue.

As described above, the characteristics of the display panel may vary depending on the refractive index, thickness, or the like of various material layers that form the display panel of the display device according to an embodiment. The display panel of the display device according to Embodiment 1 may have a thickness direction phase delay value Rth of about 0.1 nm, and the display panel of the display device according to Embodiment 2 may have a thickness direction phase delay value Rth of about −39.4 nm. Depending on a difference in characteristics of the display panel, the light reflectance of the display device and the color coordinate of the reflected light may vary. FIG. 18 to FIG. 20 shows the case where the display panel of the display device according to Embodiment 1 is applied, and FIG. 21 and FIG. 22 shows the case where the display panel of the display device according to Embodiment 2 is applied.

For the light reflectance of the display device according to the reference example (Ref.) with reference to FIG. 16, it may be determined that the light reflectance is high in the 0 degree direction, 105 degree direction, 180 degree direction, 285 degree direction and their surroundings with respect to the front (i.e., z-axis direction). The coordinate of viewing angles used for FIGS. 18, 20, and 21 is the same as the coordinate of viewing angles used for FIG. 16.

For color coordinates of the reflected light of the display device according to the reference example (Ref.) with reference to FIG. 17, the value of a* has a range of about −2 to about 4, and the value of b* has a range of about −2 to about 2.5.

For the light reflectance of the display device according to an embodiment (when the display panel of the display device according to Embodiment 1 is applied) with reference to FIG. 18, it may be determined that there is some difference according to a thickness direction phase delay value (Posi C #1 Rth) of the first compensation layer, an in-plane phase delay value (Posi A #1 Ro) of the second compensation layer, and a thickness direction phase delay value (Posi C #2 Rth) of the fourth compensation layer.

In each case, the in-plane phase delay value of the third compensation layer is 141 nm. Overall, it can be determined that the light reflectance of the display device according to the embodiment is lower than the light reflectance of the display device according to the reference example.

When a thickness direction phase delay value (Posi C #1 Rth) of the first compensation layer is −40 nm, an in-plane phase delay value (Posi A #1 Ro) of the second compensation layer is 100 nm, and a thickness direction phase delay value (Posi C #2 Rth) of the fourth compensation layer is −15 nm, it can be determined that the light reflectance of the display device according to an embodiment is relatively high in the 165-degree direction and 345-degree direction and its surroundings based on the front.

When a thickness direction phase delay value (Posi C #1 Rth) of the first compensation layer is −40 nm, an in-plane phase delay value (Posi A #1 Ro) of the second compensation layer is 100 nm, and a thickness direction phase delay value (Posi C #2 Rth) of the fourth compensation layer is −80 nm, it can be determined that the light reflectance of the display device according to an embodiment is relatively high in the 105-degree direction, the 285-degree direction, and its surroundings based on the front.

When a thickness direction phase delay value (Posi C #1 Rth) of the first compensation layer is −40 nm, an in-plane phase delay value (Posi A #1 Ro) of the second compensation layer is 75 nm, and a thickness direction phase delay value (Posi C #2 Rth) of the fourth compensation layer is −60 nm or −40 nm, it can be determined that the overall light reflectance of the display device according to an embodiment is low.

When a thickness direction phase delay value (Posi C #1 Rth) of the first compensation layer is −65 nm, −40 nm, or −15 nm, an in-plane phase delay value (Posi A #1 Ro) of the second compensation layer in is 100 nm, and a thickness direction phase delay value (Posi C #2 Rth) of the fourth compensation layer is −60 nm or −40 nm, it can be determined that the overall light reflectance of the display device according to an embodiment is low.

The thickness direction phase delay value (Posi C #1 Rth) of the first compensation layer is −40 nm, the in-plane phase delay value (Posi A #1 Ro) of the second compensation layer is 125 nm, and the thickness direction phase delay value (Posi C #2 Rth) of the fourth compensation layer is −60 nm or −40 nm, it can be seen that the overall light reflectance of the display device according to an embodiment is low.

Regarding the color coordinates of the reflected light of the display device according to an embodiment (in the case that the display panel of the display device according to Embodiment 1 is applied) with reference to FIG. 19, it can be determined that there is some difference according to the thickness direction phase delay value (Posi C #1 Rth) of the first compensation layer, the in-plane phase delay value (Posi A #1 Ro) of the second compensation layer, and the thickness direction phase delay value (Posi C #2 Rth) of the fourth compensation layer. In each case, the in-plane phase delay value of the third compensation layer is 141 nm. Overall, compared to the display device according to the reference example, it can be determined that the color coordinate of the reflected light of the display device according to an embodiment has a relatively reduced scattering range and is closer to the center representing black.

In the following, referring to FIG. 20, an example that is relatively superior in terms of light reflectance and color coordinate characteristic of reflected light and the most ideal example derived from it among the various examples shown in FIG. 18 and FIG. 19 will be compared with the reference example.

As shown in FIG. 20, when the thickness direction phase delay value of the first compensation layer (Posi C #1 Rth), the in-plane phase delay value of the second compensation layer (Posi A #1 Ro), the in-plane phase delay value of the third compensation layer (Posi A #2 Ro), and the thickness direction phase delay value (Posi C #2 Rth) of the fourth compensation layer are −40 nm/100 nm/141 nm/−60 nm (Example 1), respectively, −15 nm/100 nm/141 nm/−60 nm (Example 2), respectively, and −40 nm/75 nm/141 nm/−40 nm (Example 3), respectively, it can be determined that the light reflectance of Example 3 is low overall, the dispersion of the color coordinate of the reflected light is small, and it is close to black.

In the case of the reference example, the first and second compensation layers are not included, the in-plane phase delay value (Posi A #2 Ro) of the third compensation layer is 141 nm, and the thickness direction phase delay value (Posi C #2 Rth) of the fourth compensation layer is −75 nm, the light reflectance appears high at some viewing angles, the scattering range of the color coordinate of the reflected light is wide and far from black.

From this, an ideal case (Idle) of the light reflectance and the color coordinate characteristic of the reflected light can be derived, which is a case that a thickness direction phase delay value (Posi C #1 Rth) of the first compensation layer, an in-plane phase delay value (Posi A #1 Ro) of the second compensation layer, an in-plane phase delay value (Posi A #2 Ro) of the third compensation layer, and a thickness direction phase delay value (Posi C #2 Rth) of the fourth compensation layer are −45 nm/86 nm/141 nm/−45 nm, respectively, and it can be determined that the light reflectance is the lowest overall, the dispersion of the color coordinates of the reflected light is the smallest, and the closest to black.

In the light reflectance of the display device according to an embodiment (when the display panel of the display device according to Embodiment 2 is applied) with reference to FIG. 21, it can be determined that there are some differences according to the thickness direction phase delay value (Posi C #1 Rth) of the first compensation layer, the in-plane phase delay value (Posi A #1 Ro) of the second compensation layer, and the thickness direction phase delay value (Posi C #2 Rth) of the fourth compensation layer. In each case, the in-plane phase delay value of the third compensation layer is 141 nm. Overall, it can be determined that the light reflectance of the display device according to an embodiment is lower than the light reflectance of the display device according to the reference example.

In particular, when the thickness direction phase delay value (Posi C #1 Rth) of the first compensation layer, the in-plane phase delay value (Posi A #1 Ro) of the second compensation layer, the in-plane phase delay value (Posi A #2 Ro) of the third compensation layer, and the thickness direction phase delay value (Posi C #2 Rth) of the fourth compensation layer are −40 nm/100 nm/141 nm/−15 nm, respectively, it can be determined that the light reflectance of the display device according to an embodiment is generally low.

In the color coordinates of the reflected light of the display device according to an embodiment (when the display panel of the display device according to Embodiment e is applied) with reference to FIG. 22, it can be determined that there are some difference according to the thickness direction phase delay value (Posi C #1 Rth) of the first compensation layer, the second compensation the in-plane phase delay value (Posi A #1 Ro) of the layer and the thickness direction phase delay value (Posi C #2 Rth) of the fourth compensation layer. In each case, the in-plane phase delay value of the third compensation layer is 141 nm.

In particular, when the thickness direction phase delay value (Posi C #1 Rth) of the first compensation layer, the in-plane phase delay value (Posi A #1 Ro) of the second compensation layer, the in-plane phase delay value (Posi A #2 Ro) of the third compensation layer, and the thickness direction phase delay value (Posi C #2 Rth) of the fourth compensation layer are −40 nm/100 nm/141 nm/−15 nm, respectively, it can be determined that the color coordinate of the reflected light of the display device according to an embodiment has a relatively reduced scattering range and is closer to the center representing black.

Next, various exemplary variations of the optical member of the display device according to an embodiment will be described with reference to FIG. 23 to FIG. 26.

An optical member of a display device according to an embodiment shown in FIG. 23 to FIG. 26 is almost the same as the optical member of the display device according to the embodiment shown in FIG. 3, the description of the same part is omitted. The present embodiment is partially different from the previous embodiment in that some layers constituting optical members are omitted, which will be further described below.

FIG. 23 to FIG. 26 are cross-sectional views of various embodiments of an optical member of a display device according to an embodiment.

Figure 23:
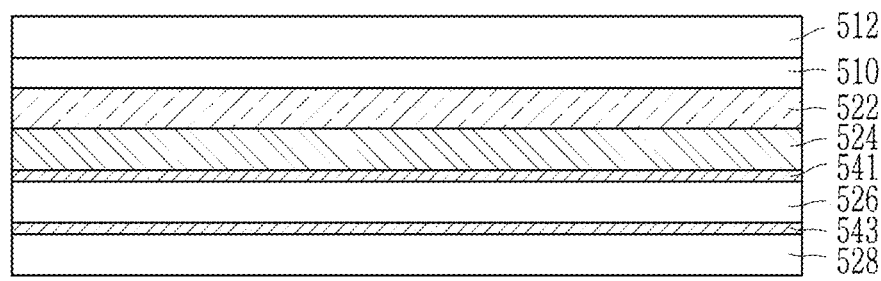
FIG. 23 to FIG. 26 are cross-sectional views of various embodiments of an optical member of a display device according to an embodiment.

As shown in FIG. 23, am optical member 50 of a display device according to an embodiment includes a polarization layer 510, and a first compensation layer 522, a second compensation layer 524, a third compensation layer 526, and a fourth compensation layer 528 positioned below the polarization layer 510. In the embodiment of FIG. 3, the second protective layer may be positioned between the polarization layer 510 and the first compensation layer 522, but in the present embodiment, a separate protective layer may not be positioned between the polarization layer 510 and the first compensation layer 522. Therefore, the polarization layer 510 may be positioned directly above the first compensation layer 522. That is, the polarization layer 510 may directly contact the first compensation layer 522.

Figure 24:
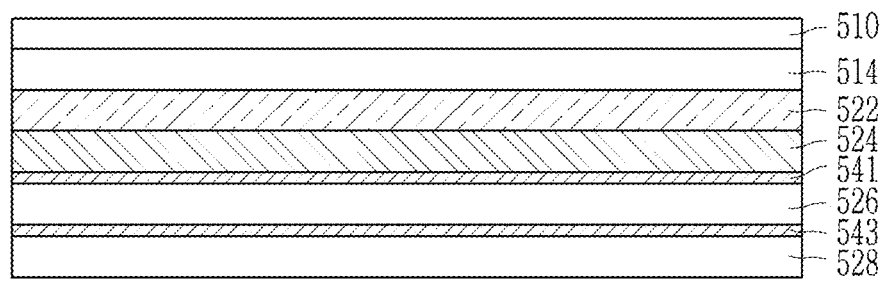

As shown in FIG. 24, an optical member of a display device according to an embodiment includes a polarization layer 510, and a first compensation layer 522, a second compensation layer 524, a third compensation layer 526, and a fourth compensation layer 528 positioned below the polarization layer 510. In the embodiment of FIG. 3, the first protective layer may be positioned on the polarization layer 510, but in the present embodiment, a separate protective layer may not be positioned on the polarization layer 510. Therefore, a separate protective layer may not be positioned between the polarization layer 510 and the window.

Figure 25:
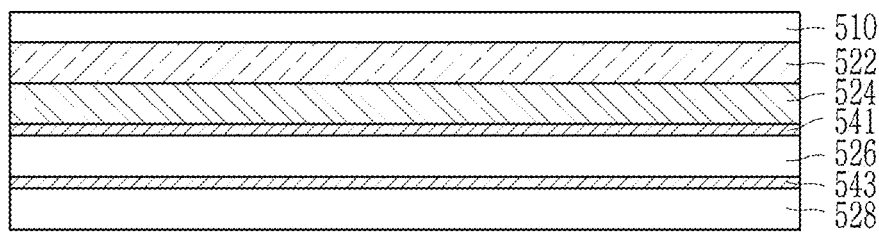

As shown in FIG. 25, an optical member 50 of a display device according to an embodiment includes a polarization layer 510, and a first compensation layer 522, a second compensation layer 524, a third compensation layer 526, and a fourth compensation layer 528 positioned below the polarization layer 510. In the embodiment of FIG. 3, the first protective layer and the second protective layer are positioned above and below the polarization layer 510, but in the present embodiment, a separate protective layer may not be positioned above and below the polarization layer 510. Therefore, the polarization layer 510 may directly contact the first compensation layer 522, and a separate protective layer may not be positioned between the polarization layer 510 and a window.

Figure 26:
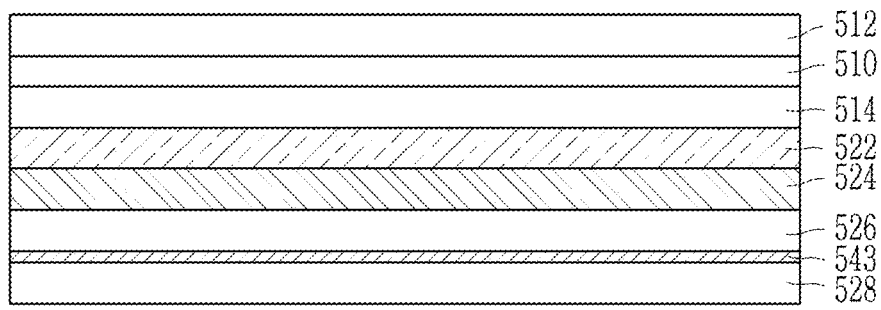

As shown in FIG. 26, an optical member 50 of a display device according to an embodiment includes a polarization layer 510, and a first compensation layer 522, a second compensation layer 524, a third compensation layer 526, and a fourth compensation layer 528 positioned below the polarization layer 510. In the embodiment of FIG. 3, the adhesive member may be positioned between the second compensation layer 524 and the third compensation layer 526, but in the present embodiment, a separate adhesive member may not be positioned between the second compensation layer 524 and the third compensation layer 526. For example, the third compensation layer 526 may be directly coated on one side of the second compensation layer 524.

In the above, numerous variations embodiment of the optical member of the display device according to the embodiment have been described, but is not limited thereto. In addition, the structure of the optical member of the display device according to the embodiment may be variously changed.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: display panel
12: window
41, 42, 43, 44: adhesive member
50: optical member
510: polarization layer
522: first compensation layer
514: second compensation layer
526: third compensation layer
528: fourth compensation layer
541, 543: adhesive member
110: substrate
191: pixel electrode
270: common electrode
272: buffer electrode
274: capping layer
370: emission layer
400: encapsulation layer
410: first inorganic encapsulation layer

What is claimed is:

1. A display device comprising
a display panel, and
an optical member positioned on the display panel,
wherein the optical member comprises:
a polarization layer positioned on the display panel;
a first compensation layer positioned between the display panel and the polarization layer;
a second compensation layer positioned between the display panel and the first compensation layer;
a third compensation layer positioned between the display panel and the second compensation layer; and
a fourth compensation layer positioned between the display panel and the third compensation layer,
wherein the first compensation layer is a positive C plate, and a thickness direction phase delay value of the first compensation layer is about −65 nanometers (nm) to about −15 nm,
the fourth compensation layer is a positive C plate, and
the second compensation layer is a positive A plate, and
an in-plane phase delay value of the second compensation layer is about 75 nm to about 125 nm,
wherein the display panel comprises:
a substrate;
a transistor positioned in the substrate;
a pixel electrode connected to the transistor;
an emission layer positioned on the pixel electrode;
a common electrode positioned on the emission layer;
a buffer electrode positioned between the emission layer and the common electrode;
a capping layer positioned on the common electrode; and
an encapsulation layer positioned on the capping layer, and
wherein a thickness direction phase delay value of the display panel is about −40 nm to about 0 nm.

2. The display device of claim 1, wherein:
the buffer electrode contains ytterbium.

3. The display device of claim 2, wherein:
the encapsulation layer comprises:
a first inorganic encapsulation layer;
an organic encapsulation layer positioned on the first inorganic encapsulation layer; and
a second inorganic encapsulation layer positioned on the organic encapsulation layer, and
wherein the first inorganic encapsulation layer includes a plurality of layers having different refractive indices.

4. The display device of claim 3, wherein:
the first inorganic encapsulation layer contains at least one of lithium fluoride (LiF), silicon nitride ($SiN_x$), silicon oxide ($SiO_x$), and silicon oxynitride ($SiO_xN_y$).

5. The display device of claim 1, wherein:
the third compensation layer is a positive A plate.

6. The display device of claim 5, wherein:
the third compensation layer is a quarter wave plate.

7. The display device of claim 6, wherein:
an angle between a slow axis of the third compensation layer and a transmissive axis of the polarization layer is about 45 degrees.

8. The display device of claim 6, wherein:
an in-plane phase delay value of the third compensation layer is about 120 nm to about 150 nm.

9. The display device of claim 5, wherein:
a thickness direction phase delay value of the fourth compensation layer is about −60 nm to about −15 nm.

10. The display device of claim 9, wherein:
the thickness direction phase delay value of the fourth compensation layer is about −45 nm.

11. The display device of claim 1, wherein:
a slow axis of the second compensation layer and a transmissive axis of the polarization layer are orthogonal.

12. The display device of claim 11, wherein:
the in-plane phase delay value of the second compensation layer is about 85 nm.

13. The display device of claim 12, wherein:
the thickness direction phase delay value of the first compensation layer is about −45 nm.

14. The display device of claim 1, wherein:
the first compensation layer, the second compensation layer, the third compensation layer, and the fourth compensation layer each are formed of a film type or liquid crystal coating layer.

15. The display device of claim 1, further comprising:
a first adhesive member positioned between the second compensation layer and the third compensation layer; and
a second adhesive member positioned between the third compensation layer and the fourth compensation layer.

16. The display device of claim 1, further comprising a window positioned on the optical member,
wherein the optical member is positioned between the display panel and the window.

17. The display device of claim 16, further comprising:
a third adhesive member positioned between the optical member and the window; and
a fourth adhesive member positioned between the optical member and the display panel.

18. The display device of claim 1, further comprising:
a rear film positioned under the display panel; and
a cushion film positioned under the rear film.

19. The display device of claim 18, further comprising:
a fifth adhesive member positioned between the display panel and the rear film; and
a sixth adhesive member positioned between the rear film and the cushion film.

\* \* \* \* \*